United States Patent [19]

Sebesta

[11] Patent Number: 4,497,684
[45] Date of Patent: Feb. 5, 1985

[54] LIFT-OFF PROCESS FOR DEPOSITING METAL ON A SUBSTRATE

[75] Inventor: Edward H. Sebesta, San Francisco, Calif.

[73] Assignee: Amdahl Corporation, Sunnyvale, Calif.

[21] Appl. No.: 468,130

[22] Filed: Feb. 22, 1983

[51] Int. Cl.³ .............................. C23F 1/02; B44C 1/22; C03C 15/00; C03C 25/06
[52] U.S. Cl. .................................... 156/643; 156/652; 156/653; 156/656; 156/657; 156/668; 156/659.1; 204/192 E; 252/79.3; 427/88; 427/272; 427/282; 430/314; 430/317; 430/318
[58] Field of Search ............... 430/313, 314, 315, 316, 430/317, 318, 329; 252/79.3; 156/643, 650, 651, 652, 653, 654, 655, 656, 657, 659.1, 668, 661.1; 427/38, 39, 40, 43.1, 88, 91, 264, 270, 271, 272, 282; 204/192 EC, 192 E

[56] References Cited

U.S. PATENT DOCUMENTS 3,849,138 11/1974 Grebe .................................. 430/314
3,873,361 3/1975 Franco et al. .................. 430/314 X
4,202,914 5/1980 Havas et al. ........................... 427/38
4,256,816 3/1981 Dunkleberger ................. 430/312 X Primary Examiner—William A. Powell
Attorney, Agent, or Firm—Fliesler, Dubb, Meyer & Lovejoy

[57] ABSTRACT

An improved method is set out for depositing a metal on a substrate to form a metal pattern. The method is particularly useful for the deposition of metal grids which form portions of microcircuits. The substrate is covered with a first sacrificial layer which is covered with a rigid second sacrificial layer which in turn is covered with a photoresist layer. The pattern which is to be deposited on the substrate is extended through the second sacrificial layer. Sufficient of the first sacrificial layer is removed to undercut the second sacrificial layer and to provide an overhanging lip portion of at least about 1000 Å overhang and an enlarged pattern on the substrate. Metal is deposited on the enlarged pattern and the first sacrificial layer is then eliminated while the metal pattern is left behind on the substrate.

17 Claims, 8 Drawing Figures

LIFT-OFF PROCESS FOR DEPOSITING METAL ON A SUBSTRATE

DESCRIPTION

1. Technical Field

The invention relates to a method for depositing a metal to form a metal pattern on a substrate, and more particularly to such a method for depositing very narrow metal strips on semiconductor devices.

2. Background Art

One of the more powerful methods for providing a pattern of very narrow metal lines upon a semiconductor is known as the "lift-off" technique. In this technique a photosensitive layer is resist exposed and developed. An energy absorption profile is produced in the photoresist layer. This results in an undercut profile after development of the photoresist layer. Metal can then be evaporated over the entire surface of the photoresist layer and the undercut with a discontinuity in existence between the metal upon the photoresist layer and the metal upon the substrate. The photoresist layer is then removed by the use of a suitable solvent, or the like, thereby removing along with it the metal which covers the photoresist and leaving behind a pattern of narrow metal conductors in faithful reproduction of the image. By this technique quite narrow lines can be deposited on the semiconductor device and multi-level metal structures can be formed.

When the photoresist layer is immediately supported by the substrate on which the metal pattern is to be deposited, the metal which is evaporated over the entire surface of the photoresist layer and the undercut may form a continuous surface with relatively thin connecting bridges between the metal in the undercut and the metal on the photoresist layer. After the photoresist layer is removed such bridges are broken as the metal which was deposited on the photoresist layer is lifted away from the substrate. Thus, the metal pattern left on the substrate is very jagged since it retains the remnants of the bridge projecting laterally and away from the substrate.

To eliminate such jagged remnants as are discussed above, it is customary to utilize a photoresist layer which is thicker than the metal pattern being deposited and to provide either a reverse taper profile for the undercut or lips at the top of the photoresist layer which overhang the area where the metal is deposited by about 100 Å to about 300 Å. This can be accomplished using any of several techniques. Another method for eliminating the problem is to deposit an assisting layer, either an inorganic dielectric material such as silicon nitride or an organic dielectric material such as a polyimide polymer, directly on the substrate with a photoresist layer atop the assisting layer. The assisting layer is then undercut and the needed lip (of about 100 Å to about 300 Å) is formed by the overhanging photoresist layer. Such techniques are discussed in an article entitled "Lift-off Techniques for Fine Line Metal Patterning" by J. M. Frary and P. Seese which appears in the December, 1981 issue of "Semiconductor International" on pages 72–89. When the metal is being deposited by a process whereby a stream of metal moves linearly downwardly, such as an electron evaporation or "e-beam" process, such techniques as are discussed in the referenced article are adequate to eliminate the problem of jagged remnants on the deposited metal pattern. However, when the metal is being deposited from a variety of directions, as occurs, for example, when the widely used magnetron sputtering technique is utilized, bridging to metal atop the photoresist or dielectric layer is not prevented and jagged remnants are a serious problem.

DISCLOSURE OF INVENTION

The present invention is directed to overcoming one or more of the problems as set forth above.

In accordance with an embodiment of the present invention, a method is set forth for depositing a metal on a substrate to form a deposited metal pattern. The method comprises providing a substrate having a surface which is covered with a first sacrificial layer which is thicker than the metal pattern which is to be deposited on the substrate and which is covered by a second rigid sacrificial layer which is covered by a third sacrificial layer which has one or more trenches exposing a desired pattern on the second sacrificial layer. The pattern is extended through the second sacrificial layer to expose substantially the pattern on the first sacrificial layer without significantly affecting the third sacrificial layer or the first sacrificial layer. The first sacrificial layer is selectively removed to partially undercut the second sacrificial layer and to provide an overhanging lip portion which exposes an enlarged similar pattern on the substrate without significantly affecting the second sacrificial layer or the substrate. The lip portions overhang the enlarged pattern by at least about 1000 Å. The metal is deposited on the enlarged pattern on the substrate and the first sacrificial layer is eliminated while the metal pattern is left on the substrate.

In accordance with preferred embodiments of the invention, the first sacrificial layer is chosen to be stable to 400° C. to 500° C. and is preferably a polyimide. Also in accordance with preferred embodiments of the invention, the second sacrificial layer is an inorganic dielectric, more preferably a low temperature oxide such as silicon dioxide. The third sacrificial layer is preferably a photoresist layer and is stripped from the second sacrificial layer prior to the selective removal of the first sacrificial layer to partially undercut the second sacrificial layer.

The present invention provides a controlled method for depositing a metal to form a pattern on a substrate, which method eliminates jagged remnants on the deposited metal even when the metal is sputtered in place from a variety of directions.

BRIEF DESCRIPTION OF THE DRAWINGS

The invention will be better understood by reference to the figures of the drawings, wherein.

BEST MODE FOR CARRYING OUT THE INVENTION

Figure 1:
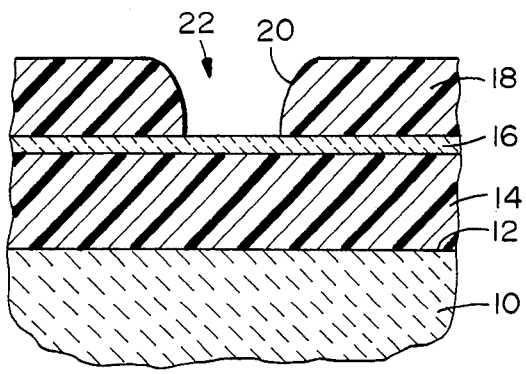
FIGS. 1–8 illustrate, sequentially, steps in a method in accordance with an embodiment of the present invention.

The invention will be described in terms of depositing a metal pattern upon a semiconductor device for microcircuit fabrication. However, it should be kept in mind that the method of the present invention has broader applications and is not meant to be limited to the microcircuitry design field.

A substrate 10, which may be silicon or any other desired material, has a surface 12 which is covered with a first sacrificial layer 14 which in turn is covered by a second sacrificial layer 16 which in turn is covered by a third sacrificial layer 18, generally a photoresist layer. The photoresist layer has been exposed and developed to provide a trench 20 which exposes a pattern 22 on the second sacrificial layer 16. The first sacrificial layer 14 is thicker than the thickness of a metal 28 which is to be deposited on the substrate 10.

Figure 2:
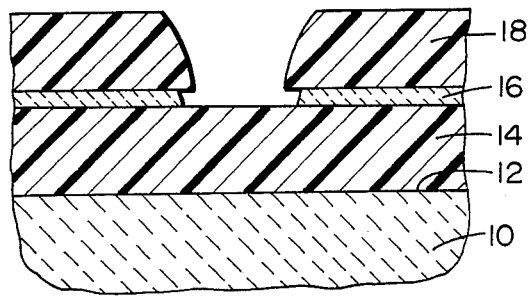

In accordance with the present invention, and as is illustrated by comparison of FIG. 2 with FIG. 1, substantially the pattern is extended through the second sacrificial layer 16 to expose substantially the pattern 22 on the first sacrificial layer 14 and this is done without significantly affecting either the photoresist layer 18 or the first sacrificial layer 14. Such can be accomplished by a proper choice of the materials of the various layers and of the specific method utilized for extending substantially the pattern 22 through the second sacrificial layer 16.

Figure 3:
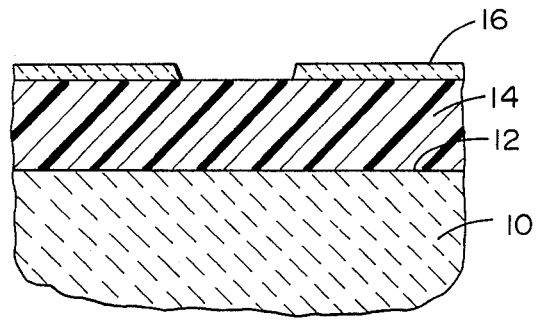
Figure 4:
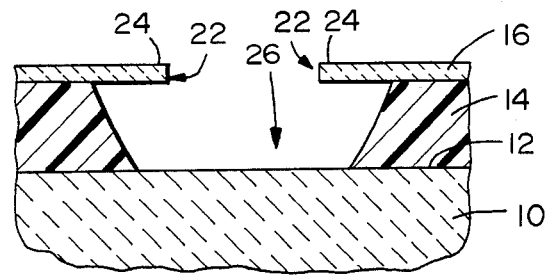

It is generally desirable, although not absolutely essential at this time, to strip the photoresist layer 18 from the second sacrificial layer 16 without significantly affecting either the second sacrificial layer 16 or the first sacrificial layer 14. If this is done, the result is that illustrated in FIG. 3.

Sufficient of the first sacrificial layer 14 is selectively removed to partially undercut the second sacrificial layer 16 to provide an overhanging lip portion 24 and to expose an enlarged pattern 26 on the substrate 10, which enlarged pattern 26 is generally geometrically similar to the pattern 22. The selective removal of this sufficient quantity of the first sacrificial layer 14 must be done without significantly affecting the second sacrificial layer 16 and without significantly affecting the substrate 10. The necessity for the second sacrificial layer 16 being rigid is now seen since it is essential to the practice of the present invention that the rigid overhanging lip portion 24 extend at least about 1000 Å over the enlarged pattern 26.

If the photoresist layer 18 has not previously been stripped from the second sacrificial layer 16 it must be stripped off prior to deposition of the metal 28 on the enlarged pattern 26.

Figure 5:
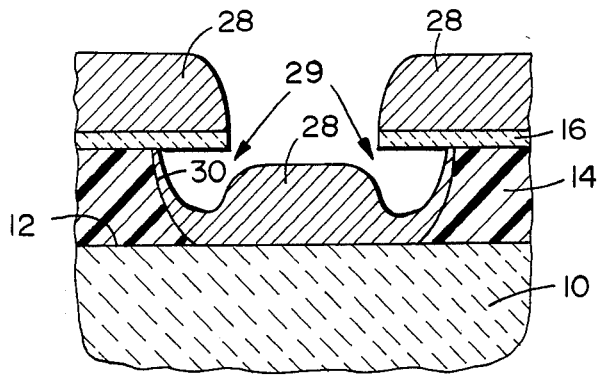

As a next step, the metal 28 is deposited on the enlarged pattern 26 on the substrate 10. Generally, the metal 28 will be deposited at the same time upon the second sacrificial layer 16. It is an advantageous feature of the present invention that the metal may be deposited by a sputtering technique without concommitant bridging of the metal 28 in the enlarged pattern 26 and on the second sacrificial layer 16. Because of the overhanging lip portion 24 a definite gap 29 (FIGS. 5 and 6) is formed between the metal 28 in the enlarged pattern 26 and the metal 28 upon the second sacrificial layer 16. FIG. 5 illustrates the completion of this step of the method of the present invention.

Figure 6:
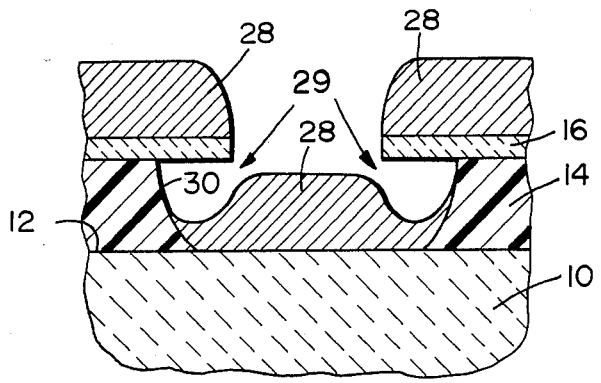

It is generally necessary at this time to remove a sufficient portion of the metal 28 to expose the first sacrificial layer 14 in the region 30 for subsequent removal. FIG. 6 illustrates the completion of this step of the method of the present invention.

The lift-off portion of the method of the present invention is now carried out by eliminating the first sacrificial layer 14 while leaving the metal 28 in the enlarged pattern 26 on the substrate 10. When the first sacrificial layer 14 is eliminated the second sacrificial layer 16, along with any metal 28 which may be on it, is simply lifted off leaving behind the desired product as shown in FIG. 7.

Figure 7:
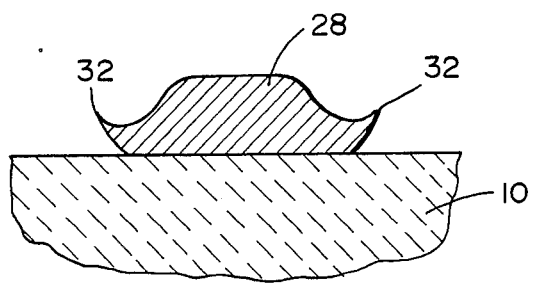
Figure 8:
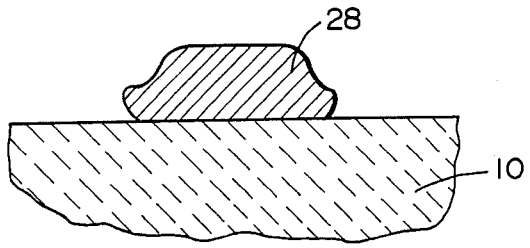

Cusps 32 which extend from the metal 28, as seen in FIG. 7, may be removed by treatment with a plasma or wet chemically to produce an improved profile for the metal 28 as shown in FIG. 8.

The particular methods used for carrying out any of the steps of the method as set out above are determined by the particular materials chosen. Typically, the substrate 10 might be a silicon substrate. In such an instance the first sacrificial layer 14 would normally be a polymer layer, most usually an organic dielectric polymer layer, and most particularly a polymer layer chosen to be stable to 400° C. to 500° C. Materials which will satisfy such criteria include various polyimide polymers. Such materials may be deposited by standard spinon or other techniques upon silicon. They have the necessary high temperature stability, and they can be removed as is required to practice the method of the present invention. For example, the polyimide polymers can be readily removed by the use of an oxygen plasma.

As will be seen by reference to FIG. 5, the metal 28 will generally cover the polymer material. This can serve to prevent an oxygen plasma from contacting the polymer material and causing its elimination. Thus, it is desirable to etch away the metal sufficiently to expose the polymer. This can be accomplished, for example, by wet chemical techniques as by utilizing an acid etch procedure. Generally, only enough etching will be carried out to expose the polymer in the area 30 as is illustrated in FIG. 6.

The material selected for the second rigid sacrificial layer 16 is preferably a low temperature oxide such as silicon dioxide. The high temperature resistance of the polyimide is particularly important since it allows the low temperature oxide to be deposited on it without its decomposing. The temperature of deposition of the low temperature oxide would, typically, be about 400° C. If the second sacrificial layer 16 is, for example, silicon dioxide, it can be etched away by wet chemical methods to extend substantially the pattern 22 through the second sacrificial layer 16. For example, hydrogen fluoride or a hydrogen fluoride-ammonium fluoride solution having a pH of 6 to 7 may be used to accomplish this and to extend the pattern 22 through the second sacrificial layer 16. Furthermore, hydrogen fluoride and hydrogen fluoride-ammonium fluoride solutions will not damage the photoresist layer 18 or the polyimide layer 14. Alternately, non-oxygen containing carbon tetrafluoride plasmas and other fluoride plasmas can be used to etch the second sacrificial layer 16. This may slightly etch the photoresist layer 18 and the first sacrificial layer 14 but such etching can be controlled to be so slight as to be non-damaging.

The photoresist layer 18 can be readily stripped from the second sacrificial layer 16 by utilizing any of a number of organic solvents, for example, acetone. The acetone will not deleteriously affect the second sacrificial layer 16 when it is a low temperature oxide layer and the polyimide 14 will not be contacted with the solvent since it is protected by the low temperature oxide layer 16.

Once the pattern 26 has been extended through the second sacrificial layer 16 the second sacrificial layer 16 can be undercut to form the lip portion 24 through use of plasma etching techniques, for example by use of an oxygen plasma. And, the oxygen plasma will not significantly affect either the low temperature oxide layer 16 or the substrate 10. Thus, the enlarged pattern 26 is provided upon the substrate 10.

The metal 28 can be deposited upon the substrate 10 and upon the second sacrificial layer 16 as well by conventional techniques, including sputtering techniques, which need no discussion here.

To properly carry out the method of the present invention with the preferred materials discussed above for microcircuit fabrication, the first sacrificial layer 14 should be considerably thicker than the second sacrificial layer 16. Also, the second sacrificial layer 16 must be of at least a minimum thickness so as to retain its rigidity and provide the lip portion 24. Generally it is preferred that the first sacrificial layer 14, preferably of a polyimide material as discussed above, be of the order of 6000 Å to 12,000 Å thick since this will normally be greater than the thickness of the metal 28 to be deposited in the enlarged pattern 26. The second sacrificial layer 16, when the material of that layer is silicon dioxide, should be greater than about 800 Å thick. Generally, the second sacrificial layer 16 will not be greater than about 3000 Å thick so as to save time in depositing of the second sacrificial layer 16.

It is preferred that the overhanging lip portion 24 overhangs the enlarged pattern 26 at least about 1000 Å, more preferably at least about 3000 Å and most preferably about 5000 Å for reasons set out above.

INDUSTRIAL APPLICABILITY

The present invention is directed to and discloses a method for depositing a metal on a substrate to form a metal pattern. It is particularly useful for depositing metal in a desired grid pattern upon a semi-conductor material to form a microcircuit.

Other aspects, objects and advantages of this invention can be obtained from a study of the drawings and the appended claims.

I claim:

1. A method of depositing a metal on a substrate to form a metal pattern, comprising:
   (a) providing a substrate having a surface covered with a first sacrificial layer of a greater thickness than said metal pattern, which first sacrificial layer is covered by a second rigid sacrificial layer, which is covered by a photoresist layer, which has one or more trenches exposing a pattern on the second sacrificial layer;
   (b) extending substantially the pattern through the second sacrificial layer to expose substantially the pattern on the first sacrificial layer without significantly affecting the photoresist layer or the first sacrificial layer;
   (c) selectively removing sufficient of the first sacrificial layer to partially undercut the second sacrificial layer to provide an overhanging lip portion and to expose an enlarged similar pattern on the substrate without significantly affecting the second sacrificial layer or the substrate, said lip portion overhanging said enlarged pattern by at least about 1000 Å;
   (d) stripping the photoresist layer from the second sacrificial layer without significantly affecting the second sacrificial layer or the first sacrificial layer;
   (e) depositing the metal on the enlarged pattern on the substrate; and
   (f) eliminating the first sacrificial layer while leaving the metal pattern on the substrate.

2. A method as set forth in claim 1, including, prior to said first sacrificial layer eliminating step (f), the additional step of:
   removing a sufficient portion of the metal to expose the first sacrificial layer.

3. A method as set forth in claim 1, wherein said second sacrificial layer is an inorganic dielectric layer and said extending step (b) comprises wet chemical etching.

4. A method as set forth in claim 3, wherein said selective removing step (c) comprises plasma etching.

5. A method as set forth in claim 4, including, prior to said first sacrificial layer eliminating step (f), the additional step of:
   removing a sufficient portion of the metal to expose the first sacrificial layer; and wherein:
   said metal removing step comprises wet chemical etching.

6. A method as set forth in claim 5, wherein said eliminating step (f) comprises plasma etching.

7. A method as set forth in claim 6, wherein said second sacrificial layer is an inorganic dielectric layer and said extending step (b) comprises wet chemical etching.

8. A method as set forth in claim 7, wherein said selective removing step (c) comprises plasma etching.

9. A method as set forth in claim 2, wherein said photoresist layer stripping step (d) precedes said selective removing step (c).

10. A method as set forth in claim 1, including, after said eliminating step (e), the additional step of:
    wet chemically etching away a portion of the metal in the metal pattern.

11. A method as set forth in claim 1, wherein said second sacrificial layer is 800 Å to 3000 Å thick.

12. A method as set forth in claim 2, wherein said second sacrificial layer is an inorganic dielectric layer and said extending step (b) comprises wet chemical etching with hydrogen fluoride or a solution of hydrogen fluoride and ammonium fluoride.

13. A method as set forth in claim 11, wherein said selective removing step (c) comprises plasma etching with oxygen.

14. A method as set forth in claim 13, wherein said metal removing step comprises wet chemical etching with an acid.

15. A method as set forth in claim 14, wherein said eliminating step (f) comprises plasma etching with oxygen.

16. A method as set forth in claim 15, including, after said eliminating step (f), the additional step of:
    wet chemically etching away a portion of the metal in the metal pattern.

17. A method as set forth in claim 16, wherein said first sacrificial layer comprises a polyimide polymer.

* * * * *